(12) United States Patent
Wen et al.

(10) Patent No.: US 9,449,960 B2
(45) Date of Patent: Sep. 20, 2016

(54) ELECTROSTATIC DISCHARGE PROTECTION STRUCTURE

(71) Applicant: United Microelectronics Corp., Hsinchu (TW)

(72) Inventors: Yung-Ju Wen, Taoyuan County (TW); Chang-Tzu Wang, Taoyuan County (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/937,142

(22) Filed: Jul. 8, 2013

(65) Prior Publication Data

US 2015/0008529 A1  Jan. 8, 2015

(51) Int. Cl.
*H01L 21/70* (2006.01)
*H01L 27/02* (2006.01)

(52) U.S. Cl.
CPC .................. *H01L 27/0277* (2013.01)

(58) Field of Classification Search
CPC ............... H01L 23/62; H01L 29/76
USPC .................. 257/369, 358, 360, 363, E27.06, 257/E29.255; 438/140, 454, 570
See application file for complete search history.

(56) References Cited

U.S. PATENT DOCUMENTS 6,320,230 B1 * 11/2001 Yu .................................. 257/355
7,518,192 B2    4/2009 Yu et al.
2002/0149059 A1 * 10/2002 Ker et al. ....................... 257/356
2005/0285200 A1 * 12/2005 Kim .............................. 257/360
2007/0210387 A1 *  9/2007 Russ et al. ..................... 257/362

OTHER PUBLICATIONS

Polgreen et al., "Improving the ESD Failure Threshold of Silicided n-MOS Output Transistors by Ensuring Uniform Current Flow", IEEE Transactions on Electron Devices, Feb. 1992, vol. 39, p. 379-388.
Amerasekera et al., "The Impact of Technology Scaling on ESD Robustness and Protection Circuit Design", IEEE Transactions on Components, Packaging, and Manufacturing Technology—Part A, Jun. 1995, vol. 18, p. 314-320.
Lee et al., "An Analytical Model of Positive H.B.M ESD Current Distribution and The Modified Multi-Finger Protection Structure", Proceedings of the 1999 7th International Symposium on the Physical and Failure Analysis of Integrated Circuits, Jul. 1999, p. 162-167.

(Continued)

*Primary Examiner* — Matthew Gordon
(74) *Attorney, Agent, or Firm* — J.C. Patents

(57) ABSTRACT

Provided is an electrostatic discharge (ESD) protection structure including a substrate, a pick-up region, a first MOS device, a second MOS device, a first doped region and a second doped region. The pick-up region is located in the substrate. The first MOS device has a first drain region of a first conductivity type located in the substrate. The second MOS device has a second drain region of the first conductivity type located in the substrate. The first drain region is closer to the pick up region than the second drain region is. The first doped region of a second conductivity type is located under the first doped region. The second doped region of the second conductivity type is located under the second doped region. The area and/or doping concentration of the first doped region is greater than that of the second doped region.

18 Claims, 5 Drawing Sheets

(56) References Cited

OTHER PUBLICATIONS

Chen et al., "Experimental investigation on the HBM ESD characteristics of CMOS devices in a 0.35-μm silicided process", International Symposium on VLSI Technology, Systems, and Applications, Jun. 1999, p. 35-38.

Amerasekera et al., "Correlating drain junction scaling, salicide thickness, and lateral NPN behavior, with the ESD/EOS performance of a 0.25 μm CMOS process ", International Electron Devices Meeting, Dec. 1996, p. 893-896.

Bock et al., "Influence of gate length on ESD-performance for deep sub micron CMOS technology ", Electrical Overstress/Electrostatic Discharge Symposium Proceedings, Sep. 1999, p. 95-104.

Ker et al., "Layout design on multi-finger MOSFET for on-chip ESD protection circuits in a 0.18-μm salicided CMOS process ", The 8th IEEE International Conference on Electronics, Circuits and Systems, Sep. 2001, vol. 1, p. 361-364.

Ker et al., "The Impact of Inner Pickup on ESD Robustness of Multi-Finger NMOS in Nanoscale CMOS Technology", 44th Annual IEEE International Reliability Physics Symposium Proceedings, Mar. 2006, p. 631-632.

* cited by examiner

ELECTROSTATIC DISCHARGE PROTECTION STRUCTURE

BACKGROUND OF THE INVENTION

1. Field of Invention

The present invention relates to a semiconductor device, and more particularly to an electrostatic discharge (ESD) protection structure.

2. Description of Related Art

ESD is a phenomenon in which charges are accumulated on a non-conductor or a non-grounded conductor and then suddenly transfer and discharge through a discharge path. The circuits in ICs can be damaged by ESD. For example, a charge carrying object, such as a human body, a machine for packaging ICs or an apparatus for testing ICs, can discharge to an IC chip when the charge carrying object is in contact with the IC chip. Thus, the IC chip is damaged or broken by the transient power of ESD.

Usually the ESD tolerance for commercially available ICs is required to pass the human body mode (HBM) test at 2 kV and the machine model (MM) test at 200 V. In order to sustain the above-mentioned high-voltage ESD tests, the large-sized ESD protection device for ICs is usually applied. This large-sized device is designed as a multi-finger shape in the layout to save the chip area as much as possible. Although the multi-finger protection device can save the chip area, such layout usually causes the non-uniform turn-on issue of the device.

SUMMARY OF THE INVENTION

The present invention provides an ESD protection structure to improve the ESD robustness thereof.

The present invention further provides an ESD protection structure in which respective parasitic bi-polar junction transistors can be turned on almost at the same time.

The present invention provides an ESD protection structure including a substrate, a pick-up region, a first MOS device, a second MOS device, a first doped region and a second doped region. The pick-up region is located in the substrate. The first MOS device is located on the substrate and includes a first drain region of a first conductivity type. The second MOS device is located on the substrate and includes a second drain region of the first conductivity type. The first drain region is closer to the pick-up region than the second drain region is. The first doped region has a second conductivity type and is located under the first drain region. The second doped region has the second conductivity type and is located under the second drain region, wherein an area, a doping concentration or both of the first doped region are greater than an area, a doping concentration or both of the second doped region.

According to an embodiment of the present invention, the first conductivity type is N-type and the second conductivity type is P-type.

According to an embodiment of the present invention, the first conductivity type is P-type and the second conductivity type is N-type.

According to an embodiment of the present invention, the first MOS device and the second MOS device are arranged in parallel to constitute a multi-finger MOS device.

According to an embodiment of the present invention, the first MOS device and the second MOS device constitute a waffle-type MOS device.

According to an embodiment of the present invention, the pick-up region has a ring shape, and the first MOS device and the second MOS device are located within a region surrounded by the pick-up region.

The present invention further provides an ESD protection structure including a substrate, a pick-up region, a plurality of MOS devices and a plurality of doped regions. The pick-up region is located in the substrate. The MOS devices are located on the substrate and respectively have a plurality of drain regions of a first conductivity type. The doped regions has a second conductivity type and are respectively located under the drain regions of the MOS devices. Areas, doping concentrations or both of the doped regions are increased toward the pick-up region.

According to an embodiment of the present invention, the first conductivity type is N-type and the second conductivity type is P-type.

According to an embodiment of the present invention, the first conductivity type is P-type and the second conductivity type is N-type.

According to an embodiment of the present invention, the MOS devices are arranged in parallel to constitute a multi-finger MOS device.

According to an embodiment of the present invention, the MOS devices constitute a waffle-type MOS device.

According to an embodiment of the present invention, the pick-up region has a ring shape, and the MOS devices are located within a region surrounded by the pick-up region.

In view of the above, in the ESD protection structure of the invention, doped regions are respectively located under drain regions having a conductivity type different from that of the doped regions, so as to improve the robustness of the ESD protection structure. Besides, the areas and/or doping concentrations of the doped regions under the drain regions can be adjusted to fix the issue caused by different distances from the doped regions to the pick-up region. Therefore, the breakdown voltages of the parasitic bi-polar junction transistors can be substantially equal, and the respective bi-polar junction transistors can be turned on almost at the same time.

In order to make the aforementioned and other objects, features and advantages of the present invention comprehensible, a preferred embodiment accompanied with figures is described in detail under.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
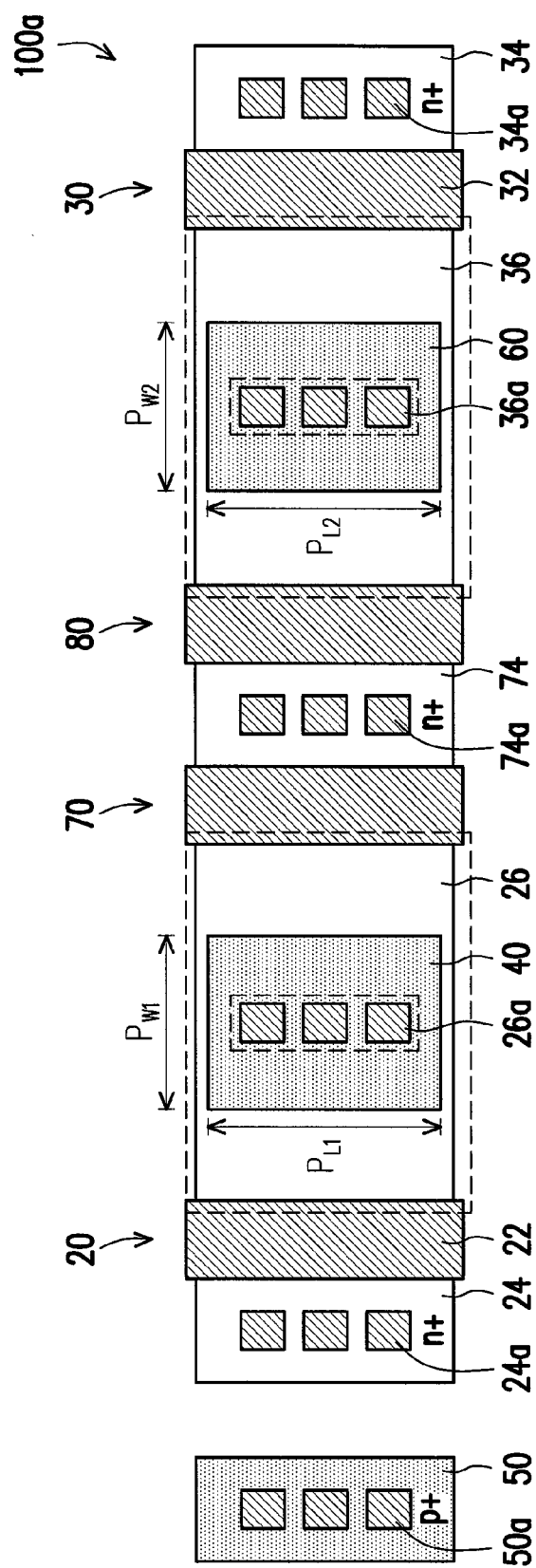
FIG. 1 illustrates a partial top view of an ESD protection structure according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In an embodiment of the invention, the ESD protection structure includes a plurality of MOS devices, doped regions are respectively located under drain regions of the MOS devices, and the drain regions have a conductivity type different from that of the doped regions. The robustness of the ESD protection structure can be improved by such disposition. Besides, the doped region close to the pick-up region has a greater area/doping concentration than that of the doped region away from the pick-up region, so that the breakdown voltages of the parasitic bi-polar junction transistors can be substantially equal, and the respective bi-polar junction transistors can be turned on almost at the same time.

Figure 2:
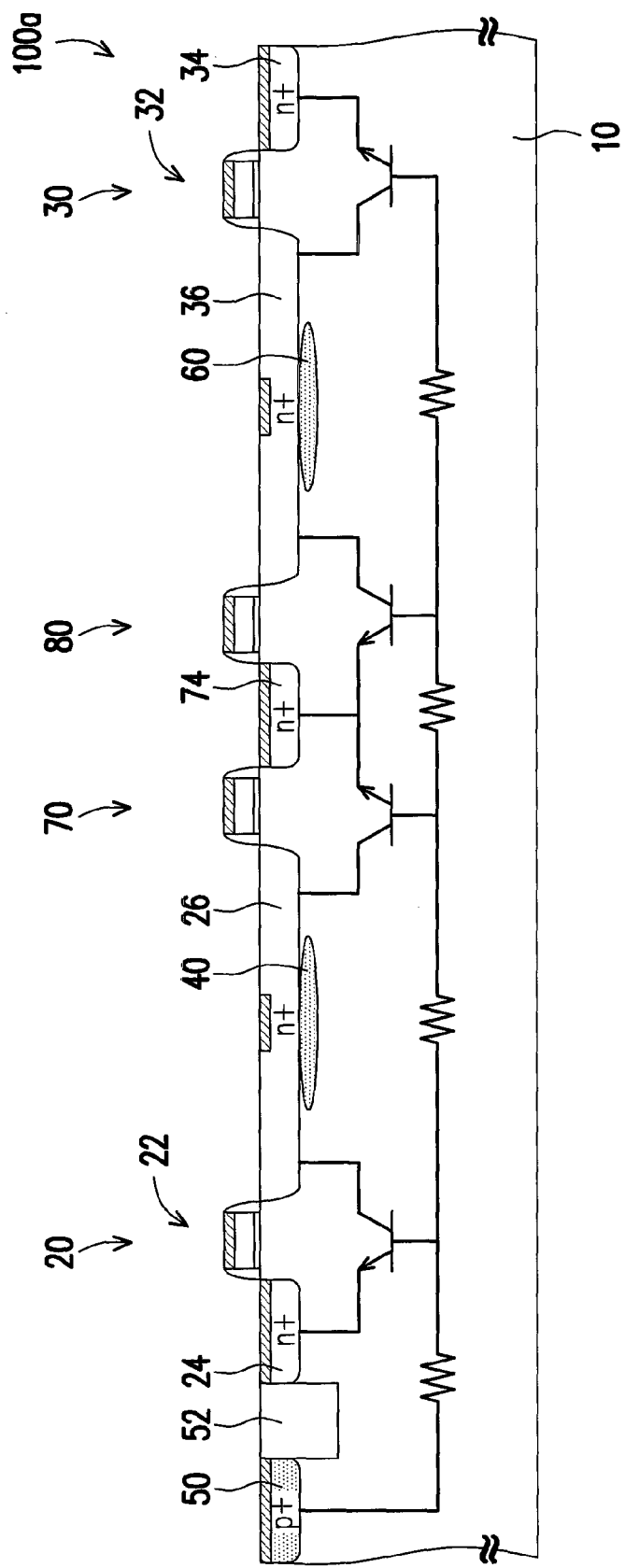
FIG. 2 illustrates a partial cross-sectional view of the ESD protection structure according to the one embodiment of the present invention.

FIG. 1 illustrates a partial top view of an ESD protection structure according to one embodiment of the present invention. FIG. 2 illustrates a partial cross-sectional view of the ESD protection structure according to the one embodiment of the present invention.

Referring to FIG. 1 and FIG. 2, the ESD protection structure 100a of the embodiment includes a substrate 10, a first MOS device 20, a second MOS device 30, a pick-up region 50, a first doped region 40 and a second doped region 60. Each of the first MOS device 20 and the second MOS device 30 has a channel of a first conductivity type. Each of the pick-up region 50, the first doped region 40 and the second doped region 60 is doped with a dopant of a second conductivity type. In an embodiment, the first conductivity type is N-type and the second conductivity type is P-type. In another embodiment, the first conductivity type is P-type and the second conductivity type is N-type. The dopant of a P-type doped region includes boron or $BF_3$. The dopant of an N-type doped region includes phosphorus or arsenic. In FIG. 1 and FIG. 2, each region is marked with "n" or "p" to represent the conductivity type thereof, and the symbol "+" indicates a region with a higher doping concentration. However, the conductivity type marked in each region in FIG. 1 and FIG. 2 is not construed as limiting the present invention.

The first MOS device 20 includes a first gate structure 22, a first source region 24 and a first drain region 26. The first gate structure 22 is located on the substrate 10 between the first source region 24 and the first drain region 26. The first gate structure 22 includes a first gate conductive layer and a first gate dielectric layer. The first gate conductive layer includes a conductor, such as metal or doped polysilicon. The first gate dielectric layer includes an insulator, such as a silicon oxide or a high-k material with a dielectric constant greater than 4. The first gate structure 22 can further include a spacer containing an insulator such as silicon oxide or silicon nitride. The first source region 24 and the first drain region 26 have a first conductivity type and are located in the substrate 10. A channel of the first conductivity type is present between the first source region 24 and the first drain region 26 and is located under the first gate structure 22.

The second MOS device 30 includes a second gate structure 32, a second source region 34 and a second drain region 36. The second gate structure 32 is located on the substrate 10 between the second source region 34 and the second drain region 36. The second gate structure 32 includes a second gate conductive layer and a second gate dielectric layer. The second gate conductive layer includes a conductor, such as metal or doped polysilicon. The second gate dielectric layer includes an insulator, such as a silicon oxide or a high-k material with a dielectric constant greater than 4. The second gate structure 32 can further include a spacer containing an insulator such as silicon oxide or silicon nitride. The second source region 34 and the second drain region 36 have the first conductivity type and are located in the substrate 10. A channel of the first conductivity type is present between the second source region 34 and the second drain region 36 and is located under the second gate structure 32.

In an embodiment, the ESD protection structure 100a can further include a third MOS device 70 and a fourth MOS device 80 which are disposed between the first MOS device 20 and the second MOS device 30. The third MOS device 70 and the first MOS device 20 share the first drain region 26. The fourth MOS device 80 and the second MOS device 30 share the second drain region 36. The fourth MOS device 80 and the third MOS device 70 share a third source region 74. In an embodiment, the first MOS device 20, the second MOS device 30, the third MOS device 70 and the fourth MOS device 80 are arranged in parallel to constitute a multi-finger MOS device.

The pick-up region 50 has a second conductivity type and is located in the substrate 10. In an embodiment, the pick-up region 50 has a ring shape, and the first MOS device 20, the second MOS device 30, the third MOS device 70 and the fourth MOS device 80 are located in the region surrounded by the pick-up region 50. The pick-up region and the first MOS device 20 are separated by an isolation structure 52. The isolation structure 52 can contain an insulating material such as silicon oxide. The isolation structure 52 can be a field oxide (FOX) layer or a shallow trench isolation (STI) structure. The first MOS device 20 is closer to the pick-up region 50 than the second MOS device 30 is. That is, the first drain region 26 of the second MOS device 20 is closer to the pick-up region 50 than the second drain region 36 of the second MOS device 30 is.

The first doped region 40 has the second conductivity type and is located under the first drain region 26 of the first MOS device 20. The second doped region 60 has the second conductivity type and is located under the second drain region 36 of the second MOS device 30. In an embodiment, the first doped region 40 and the first drain region 26 are closely adjacent to each other, and the second doped region 60 and the second drain region 36 are closely adjacent to each other, as shown in FIG. 2. In another embodiment, the distance from the top surface of the first doped region 40 to the bottom surface of the first drain region 26 is about 0.05 µm to 0.2 µm. Similarly, the distance from the top surface of the second doped region 60 to the bottom surface of the second drain region 36 is about 0.05 µm to 0.2 µm. The disposition of the first doped region 40 and the second doped region 60 is beneficial to improve the robustness of the ESD protection structure. The first doped region 40 has a width $P_{W1}$, a length $P_{L1}$ and an area $A_1=P_{W1} \times P_{L1}$. The second doped region 60 has a width $P_{W2}$, a length $P_{L2}$ and an area $A_2=P_{W2} \times P_{L2}$. The areas and/or doping concentrations affect the breakdown voltages of the lateral diodes. In an embodiment, the first drain region 26 is closer to the pick-up region 50 than the second drain region 36 is, and the area A1 of the first doped region 40 is greater than the area A2 of the second doped region 60. In another embodiment, the first drain region 26 is closer to the pick-up region 50 than the second drain region 36 is, and the doping concentration of the first doped region 40 is greater than the doping concentration of the second doped region 60. In yet another embodiment, the first drain region 26 is closer to the pick-up region 50 than the second drain region 36 is, and the area A1 and the doping concentration of the first doped region 40 are greater than the area A2 and the doping concentration of the second doped region 60.

Generally, the parasitic bipolar junction transistor (BJT) is turned on by the leakage current Ioff of the substrate 10. The value of the leakage current almost maintains constant in the substrate. The turn-on speed of the parasitic BJT is determined by the base to emitter voltage Vbe which is equal to the product of the leakage current Ioff multiplied by the substrate resistance Rsub (i.e. Vbe=Ioff×Rsub). The first doped region 40 is located close to the pick-up region 50, so the resistance of the substrate 10 is smaller, and thus, the voltage Vbe is smaller and the parasitic BJT is turned on more slowly. On the contrary, the second doped region 60 is located away from the pick-up region 50, so the resistance of the substrate 10 is greater, and thus, the voltage Vbe is greater and the parasitic BJT is turned on more quickly. Therefore, the non-uniform turn-on phenomenon occurs because the respective bi-polar junction transistors are turned on at different time points.

In view of the above, the voltage Vbe is the key factor to determine whether the parasitic BJT is turned on, wherein Vbe=Ioff×Rsub. According to this embodiment, the leakage current Ioff is proportional to the area A of the doped region; that is, Ioff≈k×A, wherein k is a proportional constant. Therefore, in order to enable the respective bi-polar junction transistors to be turned on simultaneously (i.e. to render the voltage Vbe of each BJT the same), the following relationship can be deduced:

$$Vbe \approx Ioff \times Rsub \approx k \times A \times Rsub$$

Therefore, if the second doped region 60 away from the pick-up region 50 has an area A2 and the first doped region 40 close to the pick-up region 50 has an area A1, it can be deduced that the second doped region 60 requires a smaller area because Rsub is greater at the position away from the pick-up region 50, and the first doped region 40 requires a greater area because Rsub is smaller at the position close to the pick-up region 50. In such manner, regardless of the positions of the parasitic bi-polar junction transistors, the voltages Vbe of the respective parasitic bi-polar junction transistors can be substantially equal, and thus, the respective bi-polar junction transistors can be turned on almost at the same time.

In view of the foregoing, it is known that the respective bi-polar junction transistors are turned on at different time points because the first doped region 40 and the second doped region 60 have different distances to the pick-up region 50. In this embodiment, the area A1, the doping concentration or both of the first doped region 40 are changed to be greater than the area A2, the doping concentration or both of the second doped region 60. In such manner, the issue caused by different distances from the first doped region 40 and the second doped region 60 to the pick-up region 50 can be fixed, so that the breakdown voltages of the lateral parasitic diodes can be substantially equal, and the respective bi-polar junction transistors can be turned on almost simultaneously.

A plurality of contacts 50a, 24a, 26a, 34a, 36a and 74a are located respectively on the pick-up region 50, the first source region 24, the first drain region 26, the second source region 34, the second drain region 36 and the third source region 74. Each of the contacts 50a, 24a, 26a, 34a, 36a and 74a can include a conductor. Besides, the structure of each of the contacts 50a, 24a, 26a, 34a, 36a and 74a can include a barrier layer and a main conductive layer. The barrier layer can be a Ti/TiN composite layer, a Ta/TaN composite layer or a combination thereof. The main conductive layer can be a tungsten layer, a copper layer or an aluminium layer. In addition, to ensure the low resistance and Ohmic contact, a metal silicide layer can be optionally located between the contact 50a and the pick-up region 50, between the contact 24a and the first source region 24, between the contact 26a and the first drain region 26, between the contact 34a and the second source region 34, between the contact 36a and the second drain region 36, and between the contact 74a and the third source region 74.

Figure 3:
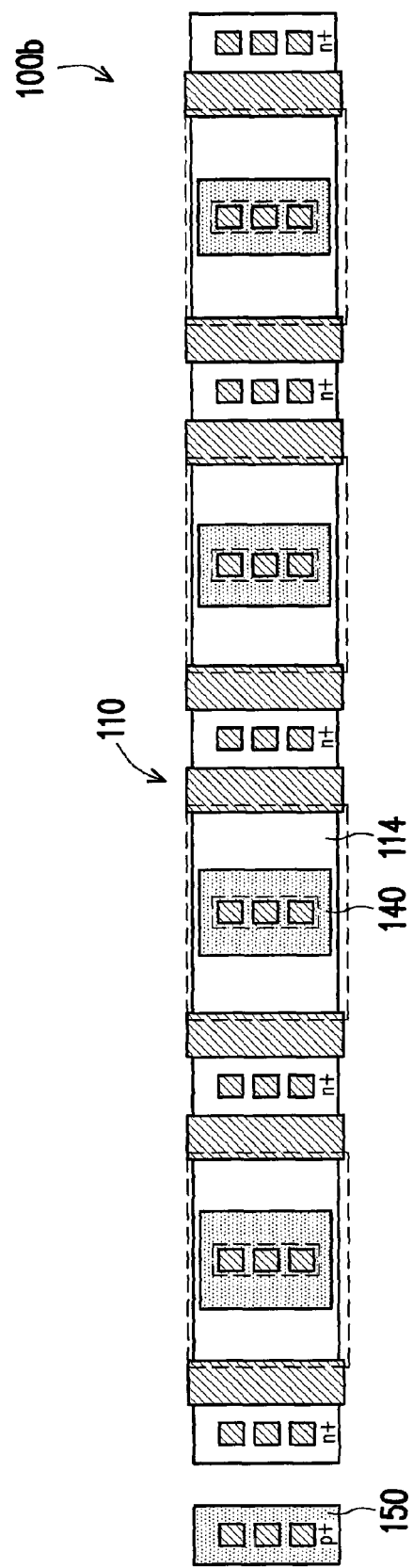
FIG. 3 illustrates a partial top view of an ESD protection structure according to another embodiment of the present invention.
Figure 4:
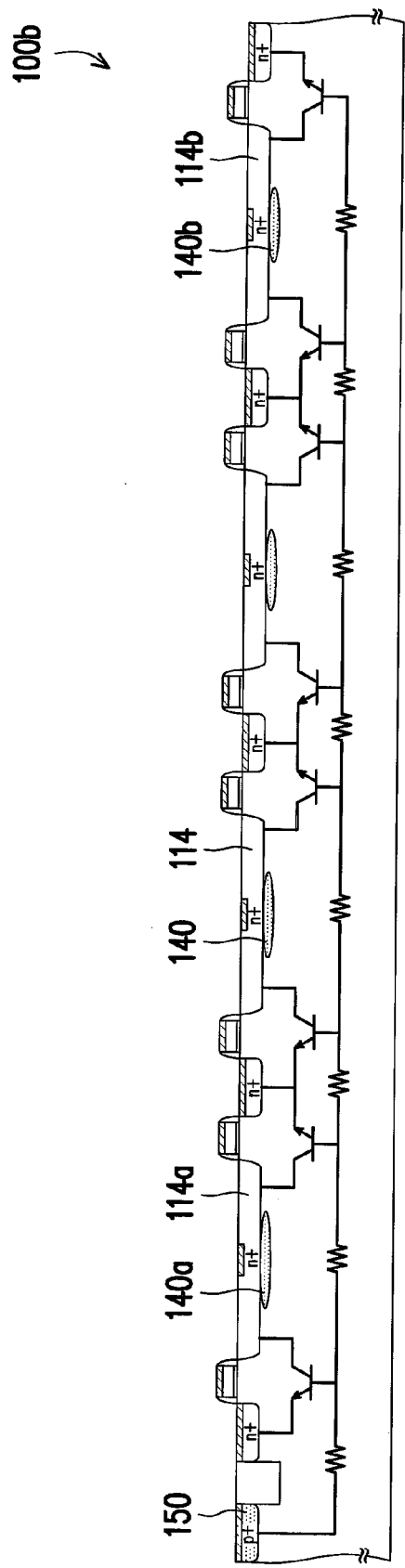
FIG. 4 illustrates a partial cross-sectional view of the ESD protection structure according to the another embodiment of the present invention.

In another embodiment, referring to FIG. 3 and FIG. 4, the ESD protection structure 100b includes a plurality of MOS devices 110. A plurality of doped regions 140 are located respectively under the drain regions 114 of the MOS devices 110. The conductivity type of the doped regions 140 is different from that of the drain regions 114. Areas and/or doping concentrations of the doped regions 140 are increased toward the pick-up region 150, or the areas and/or doping concentrations of the doped regions 140 are decreased away from the pick-up region 150.

In an embodiment, referring to FIG. 1 and FIG. 2, in the ESD protection structure 100a, the first MOS device 20, the second MOS device 30, the third MOS device 70 and the fourth MOS device 80 are arranged in parallel to constitute a multi-finger MOS device. The pick-up region 50 surrounds the first MOS device 20, the second MOS device 30, the third MOS device 70 and the fourth MOS device 80. Similarly, referring to FIG. 3 and FIG. 4, in the ESD protection structure 100b, the MOS devices 110 are arranged in parallel to constitute a multi-finger MOS device. The pick-up region 150 surrounds the MOS devices 110.

Figure 5:
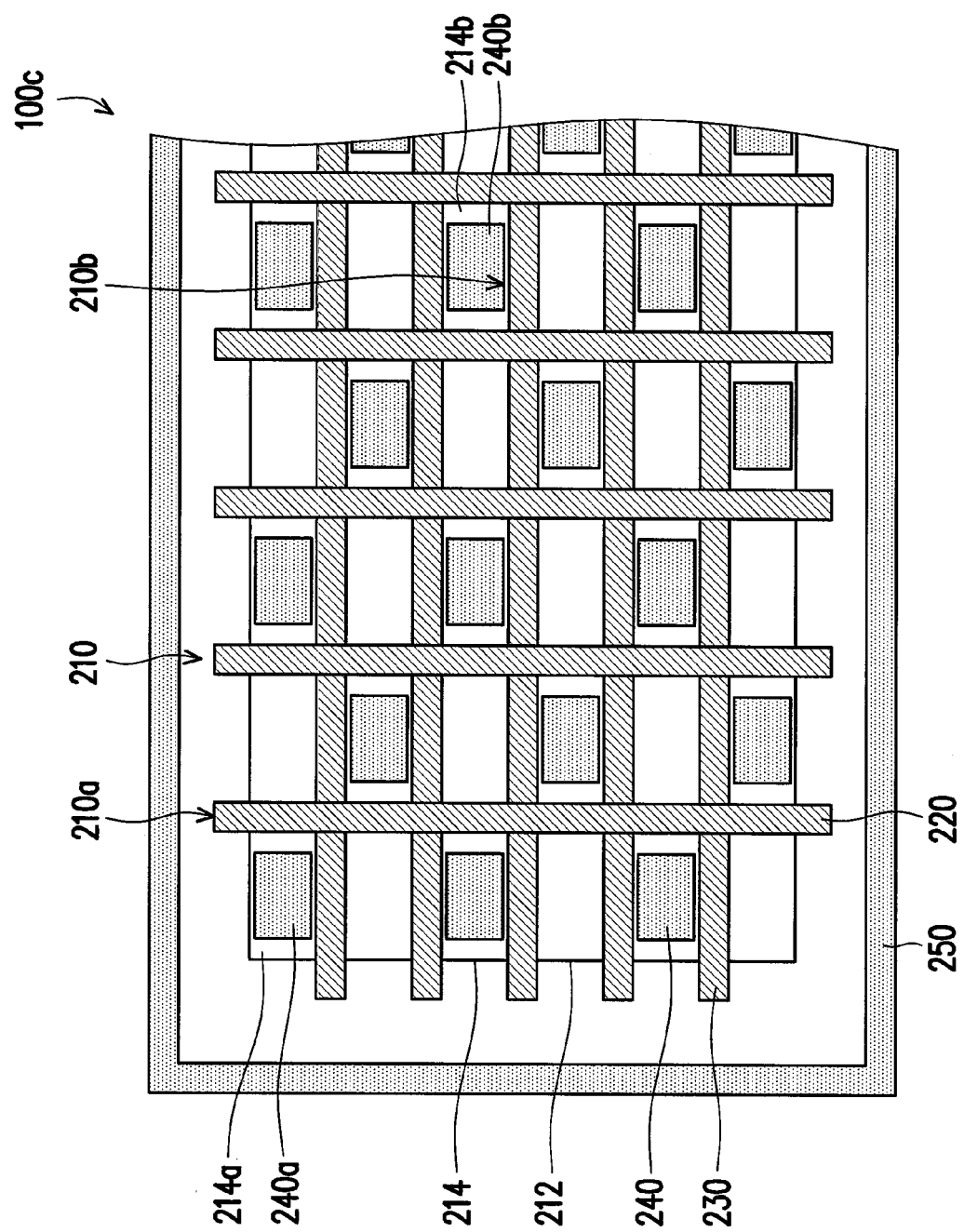
FIG. 5 illustrates a top view of an ESD protection structure according to yet another embodiment of the present invention.

In yet another embodiment, referring to FIG. 5, the ESD protection structure 100c includes a plurality of MOS devices 210 arranged in a waffle/chessboard shape. Specifically, in the ESD protection structure 100c, the MOS devices 210 includes a plurality of gate structures 220 arranged in a first direction and a plurality of gate structures 230 arranged in a second direction. In an embodiment, the first direction is perpendicular to the second direction. The gate structures 220 and the gate structures 230 constitute a plurality of squares of a chessboard. Source regions 212 and drain regions 214 are arranged alternately in the squares, so that one source region 212 is surrounded by four drain regions 214, and one drain region 214 is surrounded by four source regions 212. The pick-up region 250 surrounds the MOS devices 210 arranged in a waffle shape.

In the MOS devices 210 arranged in a waffle shape, the MOS device 210b at the center thereof has the longest distance to the pick-up region 250, and the MOS device 210a at the edge thereof has the shortest distance to the pick-up region 250. Therefore, the non-uniform turn-on issue of the parasitic bi-polar junction transistors is even more serious in such waffle-type MOS device. Similar to the previous embodiments, doped regions 240 can be located respectively under the drain regions 214, and the doped regions 240 have a conductivity type different from that of the source regions 212 and the drain regions 214. The area/doping concentration of the doped region 240a close to the pick-up region 250 can be designed to be greater than the area/doping concentration of the doped region 240b away from the pick-up region 250. Alternatively, areas/doping concentrations of the doped regions 240 are increased toward the pick-up region 250. In such manner, the issue caused by different distances from the doped regions 240 to the pick-up region 250 can be fixed, so that the breakdown voltages of the lateral parasitic diodes can be substantially equal, and the respective bi-polar junction transistors can be turned on almost simultaneously.

The said embodiment in which the pick-up region surrounds the waffle-type MOS device is provided only for illustration purposes, and is not construed as limiting the present invention. In another embodiment, the pick-up region can also be located between two adjacent MOS devices or between two sets of MOS devices adjacent to each other.

In summary, in the ESD protection structure of the invention, doped regions are respectively located under drain regions having a conductivity type different from that of the doped regions, so as to improve the robustness of the ESD protection structure. Besides, the areas and/or doping concentrations of the doped regions under the drain regions can be adjusted to fix the issue caused by different distances from the doped regions to the pick-up region. Therefore, the breakdown voltages of the parasitic bi-polar junction transistors can be substantially equal, and the respective bi-polar junction transistors can be turned on almost at the same time.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An electrostatic discharge (ESD) protection structure, comprising:
    a substrate;
    a pick-up region, located in the substrate;
    a first MOS device, located on the substrate and comprising a first drain region and a first source region of a first conductivity type;
    a second MOS device, located on the substrate and comprising a second drain region and a second source region of the first conductivity type, wherein the first drain region is closer to the pick-up region than the second drain region is;
    a first doped region of a second conductivity type, located only under the first drain region; and
    a second doped region of the second conductivity type, located only under the second drain region, wherein an area, a doping concentration or both of the first doped region are greater than an area, a doping concentration or both of the second doped region,
    wherein there is only one doped region of the second conductivity type under each drain region of the first conductivity type,
    wherein the first doped region and the second doped region are disposed in the substrate, and a doping concentration of the first doped region and a doping concentration of the second doped region are different from a doping concentration of the substrate which surrounds the first and second doped regions.

2. The ESD protection structure of claim 1, wherein the first conductivity type is N-type and the second conductivity type is P-type.

3. The ESD protection structure of claim 1, wherein the first conductivity type is P-type and the second conductivity type is N-type.

4. The ESD protection structure of claim 1, wherein the first MOS device and the second MOS device are arranged in parallel to constitute a multi-finger MOS device.

5. The ESD protection structure of claim 1, wherein the first MOS device and the second MOS device constitute a waffle-type MOS device.

6. The ESD protection structure of claim 1, wherein the pick-up region has a ring shape, and the first MOS device and the second MOS device are located within a region surrounded by the pick-up region.

7. The ESD protection structure of claim 1, wherein the substrate is in direct contact with the first doped region and the second doped region, respectively.

8. The ESD protection structure of claim 1, wherein the substrate surrounds and direct contacts the first drain region and the second drain region.

9. The ESD protection structure of claim 1, wherein an isolation structure is disposed between the pick-up region and the first source region.

10. An electrostatic discharge (ESD) protection structure, comprising:
    a substrate;
    a pick-up region, located in the substrate;
    a plurality of MOS devices, located on the substrate and respectively having a plurality of drain regions and a plurality of source regions of a first conductivity type;
    a plurality of doped regions of a second conductivity type, respectively located only under the drain regions of the MOS devices,
    wherein the doped regions are disposed in the substrate, and areas of the doped regions are increased toward the pick-up region, and
    wherein there is only one doped region of the second conductivity type under each drain region of the first conductivity type,
    wherein a doping concentration of each of the plurality of doped regions is different from a doping concentration of the substrate which surrounds the plurality of doped regions.

11. The ESD protection structure of claim 10, wherein the first conductivity type is N-type and the second conductivity type is P-type.

12. The ESD protection structure of claim 10, wherein the first conductivity type is P-type and the second conductivity type is N-type.

13. The ESD protection structure of claim 10, wherein the MOS devices are arranged in parallel to constitute a multi-finger MOS device.

14. The ESD protection structure of claim 10, wherein the MOS devices constitute a waffle-type MOS device.

15. The ESD protection structure of claim 10, wherein the pick-up region has a ring shape, and the MOS devices are located within a region surrounded by the pick-up region.

16. The ESD protection structure of claim 10, wherein the substrate is in direct contact with the plurality of doped regions.

17. The ESD protection structure of claim 10, wherein the substrate surrounds and direct contacts the plurality of drain regions.

18. The ESD protection structure of claim 10, wherein an isolation structure is disposed between the pick-up region and a nearby source region.

* * * * *